United States Patent
Alacchi et al.

(10) Patent No.: US 12,112,820 B2
(45) Date of Patent: Oct. 8, 2024

(54) SINGLE EVENT EFFECT MITIGATION WITH SMART-REDUNDANCY

(71) Applicant: University of Utah Research Foundation, Salt Lake City, UT (US)

(72) Inventors: Aurelien Alacchi, Salt Lake City, UT (US); Pierre-Emmanuel Gaillardon, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 17/539,923

(22) Filed: Dec. 1, 2021

(65) Prior Publication Data

US 2023/0170038 A1 Jun. 1, 2023

(51) Int. Cl.
*G11C 29/44* (2006.01)
*G11C 7/06* (2006.01)
*G11C 7/10* (2006.01)
*G11C 29/00* (2006.01)
*G11C 29/38* (2006.01)

(52) U.S. Cl.
CPC ........... *G11C 29/4401* (2013.01); *G11C 7/06* (2013.01); *G11C 7/1057* (2013.01); *G11C 7/1084* (2013.01); *G11C 29/38* (2013.01); *G11C 29/789* (2013.01)

(58) Field of Classification Search
CPC ..... G11C 29/4401; G11C 7/06; G11C 7/1057; G11C 7/1084; G11C 29/38; G11C 29/789
See application file for complete search history.

(56) References Cited

U.S. PATENT DOCUMENTS

| | | | |
|---|---|---|---|
| 7,309,866 B2 | 12/2007 | Hannah | |
| 7,521,765 B2* | 4/2009 | Tsutsumi | H10B 10/12 257/E27.098 |
| 7,821,075 B2* | 10/2010 | Snyder | H01L 29/7839 257/E27.068 |
| 7,875,854 B2 | 1/2011 | Cannon et al. | |

(Continued)

OTHER PUBLICATIONS

Wirthlin et al.; "High-Reliability FPGA-Based Systems: Space, High-Energy Physics, and Beyond;" Proceedings of the IEEE; (Mar. 2015); pp. 379-389; vol. 103, No. 3; <doi:10.1109/JPROC.2015.2404212 >.

*Primary Examiner* — Vanthu T Nguyen
(74) *Attorney, Agent, or Firm* — Thorpe North & Western, LLP (57) ABSTRACT

Electronic devices and methods for single event effect mitigation are described. The device can include a processor, a memory cell, and an integrated particle sensor. The memory cell can comprise a substrate, a deep well coupled to the substrate, and a ground-coupled well coupled to the deep well. The integrated particle sensor can be coupled between the substrate and the deep well, and the ground-coupled well and the deep well. The integrated particle sensor can be operable to detect an ionizing particle generating the single event effect. The electronic device can be a field-programmable gate array. The method can include detecting an ionizing particle generating a single event effect at a memory cell of the electronic device, switching from the memory cell to a redundant memory cell associated with the memory cell when the single event effect is detected, and reconfiguring the memory cell based on the redundant memory cell.

18 Claims, 8 Drawing Sheets

(56) References Cited

U.S. PATENT DOCUMENTS

| | | |
|---|---|---|
| 7,880,340 B2 | 2/2011 | Miller |
| 8,042,071 B2* | 10/2011 | Moyer .................. G11C 5/005 |
| | | 716/112 |
| 8,896,978 B2 | 11/2014 | Baumann |
| 9,223,037 B2 | 12/2015 | Cannon et al. |
| 9,368,193 B2* | 6/2016 | Krilic .................. G11C 11/412 |
| 10,204,906 B2* | 2/2019 | Zhang .................... G11C 5/14 |
| 2017/0082689 A1 | 3/2017 | Gaspard et al. |
| 2020/0387423 A1 | 12/2020 | Chen et al. |

* cited by examiner

SINGLE EVENT EFFECT MITIGATION WITH SMART-REDUNDANCY

GOVERNMENT INTEREST

This invention was made with government support under grant FA8650-18-2-78555 awarded by the Department of Defense/DARPA. The government has certain rights in this invention.

FIELD OF THE DISCLOSURE

The present disclosure relates to electronic devices, memory cells, and sensors. Therefore, the present disclosure relates generally to the fields of electrical engineering and material science.

BACKGROUND

Field Programmable Gate Arrays (FPGAs) are used in aerospace applications due to their versatility and mission reconfigurability capabilities. However, FPGAs are subject to Single Event Upset (SEU) and Single Event Transient (SET) errors in which a particle going through the device can generate a current variation. These events can lead to functional errors by affecting the FPGA memory.

SEUs and SETs are unavoidable, but many hardware and software methods have been used to counter the bitstream alteration impact on logic and routing. Design reinforcement to architecture of cells and fabrication processes, such as Silicon On Insulator (SOI), are examples of hardware implementations which attempt to minimize the probability of such events. Redundancy and bitstream reprogramming are hardware and software co-design methods. Triple Modular Redundancy (TMR) is one mitigation technique against SEU/SET, but TMR uses a 3× reduction in Maximal Design Capacity (MDC) compared to an unhardened design and does not repair the FPGA's bitstream. Bitstream scrubbing is one reprogramming method to address such events, but its speed depends on the size of the design and can often have a significant negative performance impact. Consequently, the detection time varies with the design and the FPGA architectures which results in variations on the memory Time-In-Error (TIE) between events.

SUMMARY

In one embodiment, an electronic device for single event effect mitigation can comprise a processor, a memory cell, and an integrated particle sensor. In one aspect, the memory cell can include a substrate, a deep well coupled to the substrate, and a ground-coupled well coupled to the deep well. In one aspect, the integrated particle sensor can be coupled between: the substrate and the deep well, and the ground-coupled well and the deep well. In one aspect, the integrated particle sensor can be operable to detect an ionizing particle generating the single event effect.

In another embodiment, at least one non-transitory machine-readable storage medium can have instructions embodied thereon for single event effect mitigation. The instructions, when executed by one or more processors at an electronic device, can perform the following: detecting an ionizing particle generating a single event effect at a memory cell of the electronic device; switching from the memory cell to a redundant memory cell associated with the memory cell when the single event effect is detected; reconfiguring the memory cell based on the redundant memory cell; and switching from the redundant memory cell to the memory cell after the memory cell is reconfigured.

In another embodiment, a field-programmable gate array (FPGA) can be operable for single event effect mitigation. The FPGA can comprise a memory cell and an integrated particle sensor. In one aspect, the memory cell can include a substrate, a deep well coupled to the substrate, and a ground-coupled well coupled to the deep well. In one aspect, an integrated particle sensor can be coupled between the substrate and the deep well, and the ground-coupled well and the deep well. In one aspect, the integrated particle sensor can be operable to detect an ionizing particle generating the single event effect.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure.

These drawings are provided to illustrate various aspects of the invention and are not intended to be limiting of the scope in terms of dimensions, materials, configurations, arrangements, or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

The singular forms "a," "an," and "the" include plural referents unless the context clearly dictates otherwise. Thus, for example, reference to "a processor" includes reference to one or more of such structures and reference to "detecting" refers to one or more of such steps.

As used herein with respect to an identified property or circumstance, "substantially" refers to a degree of deviation that is sufficiently small so as to not measurably detract from the identified property or circumstance. The exact degree of deviation allowable may in some cases depend on the specific context. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, the term "about" is used to provide flexibility and imprecision associated with a given term, metric or value. The degree of flexibility for a particular variable can be readily determined by one skilled in the art. However, unless otherwise enunciated, the term "about" generally connotes flexibility of less than 2%, and most often less than 1%, and in some cases less than 0.01%.

As used herein, comparative terms such as "increased," "decreased," "better," "worse," "higher," "lower," "enhanced," "improved," "maximized," "minimized," and the like refer to a property of a device, component, composition, or activity that is measurably different from other devices, components, compositions, or activities that are in a surrounding or adjacent area, that are similarly situated, that are in a single device or composition or in multiple comparable devices or compositions, that are in a group or class, that are in multiple groups or classes, or as compared to an original or baseline state, or the known state of the art. For example, a sensor with "increased" sensitivity can refer to a sensor in a sensor array which has a lower level or threshold of detection than one or more other sensors in the array. A number of factors can cause such increased sensitivity, including materials, configurations, architecture, connections, etc.

Reference in this specification may be made to devices, structures, systems, or methods that provide "improved" performance. It is to be understood that unless otherwise stated, such "improvement" is a measure of a benefit obtained based on a comparison to devices, structures, systems or methods in the prior art. Furthermore, it is to be understood that the degree of improved performance may vary between disclosed embodiments and that no equality or consistency in the amount, degree, or realization of improved performance is to be assumed as universally applicable.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open-ended term, like "comprising" or "including," in the written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein.

The term "coupled," as used herein, is defined as directly or indirectly connected in a biological, chemical, mechanical, electrical, or nonelectrical manner. "Directly coupled" structures or elements are in contact with one another. In this written description, recitation of "coupled" or "connected" provides express support for "directly coupled" or "directly connected" and vice versa. Objects described herein as being "adjacent to" each other may be in physical contact with each other, in close proximity to each other, or in the same general region or area as each other, as appropriate for the context in which the phrase is used.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of." For example, "at least one of A, B and C" explicitly includes only A, only B, only C, or combinations of each.

Numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Occurrences of the phrase "in one embodiment," or "in one aspect," herein do not necessarily all refer to the same embodiment or aspect. Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of invention embodiments is provided below, and specific embodiments are then described in further detail. This initial summary is intended to aid readers in understanding the technological concepts more quickly but is not intended to identify key or essential features thereof, nor is it intended to limit the scope of the claimed subject matter.

High radiation environments, such as outer space, are characterized by large numbers of charged particles interacting with the environment. When one of these charged particles hits a device, it can generate electron-hole pairs. These electron-hole pairs can generate current variations that are proportional to the particle's charge. When these events happen on a logical region of a field-programmable gate array (FPGA), the events are referred to as single event transients (SETs). These SETs can be relatively harmless to the FPGA unless the SETS occur near a clock edge—which can result in a setup violation, a hold time violation, or a wrong value captured by a Flip-Flop (FF) or register. Thus, SETs are one-time that can be propagated further in the FPGA but can be locally repaired during the next clock cycle.

When a charged particle hits a device, generates electron-hole pairs, and results in current variations that appear in memories, FFs, or registers with sufficient energy to overwrite the stored data, then the type of event is referred to as a single event upset (SEU). In an FPGA bitstream, an SEU can result in unexpected design modifications. SEUs can be detrimental because configuration memories do not refresh as often as FFs. Process and architecture hardening can increase the threshold energy to trigger an SEU but decreases in technology nodes can decrease the threshold energy to trigger an SEU.

Therefore, FPGA configuration memories that are exposed to charged particles can change the FPGA's behavior. Radiation-Hardening (Rad-Hard) methods for FPGAs can include: (a) triplicating the logic, (b) reinforcing the memories, and (c) bitstream scrubbing with partial reconfiguration. Nonetheless, these methods result in performance degradation including: (i) a 3× reduction of Maximal Design Capacity (MDC), and (ii) an average Time-In-Error (TIE) proportional to design size. Triple Modular Redundancy with Partial Redundancy can attempt to counter transient effects but increases the used area by 3× and adds complexity to design flow and component routing. Memory scrubbing can attempt to refresh errored values but is a relatively slow process during which an additional SET or SEU event could result in the impossibility of repair.

Single events effects (i.e., SETs and SEUs) can be mitigated by using integrating a sensor to instantaneously detect single event effects. Based on the error detection, the faulty values can be repaired. While an element is repaired, the redundant element can provide the expected behavior. The particle sensors can detect SEUs/SETs, trigger partial reconfiguration, and dynamically switch between faulty and correct parts of the design. Integrating particle sensors as described herein can: (1) provide a 33.33% enhancement in MDC by increasing the area by 41.08% for a 40 nm technology node with 12T memory cells, and (2) outperform bitstream scrubbing in TIE by about 10,000× compared to TMR by replacing bitstream scrubbing with partial reconfiguration.

Additionally, as disclosed herein, when a 6T memory architecture is used, a 1.7% reduction in area can be provided compared to a Rad-Hard 12T architecture without a reduction in performance compared to the Rad-Hard 12T architecture. That is, the SET mitigation can trigger the reconfiguration as though the SET were an SEU, and thereby reduce the amount of area without a reduction in performance. These results can increase the devices' reliability for various applications in high radiation environments.

Therefore, in one embodiment, an electronic device for single event effect mitigation can comprise a processor, a memory cell, and an integrated particle sensor. In one aspect, the memory cell can include a substrate, a deep well coupled to the substrate, and a ground-coupled well coupled to the deep well. In one aspect, the integrated particle sensor can be coupled between: the substrate and the deep well, and the ground-coupled well and the deep well. In one aspect, the integrated particle sensor can be operable to detect an ionizing particle generating the single event effect.

In another embodiment, a field-programmable gate array (FPGA) can be operable for single event effect mitigation. The FPGA can comprise a memory cell and an integrated particle sensor. In one aspect, the memory cell can include a substrate, a deep well coupled to the substrate, and a ground-coupled well coupled to the deep well. In one aspect, an integrated particle sensor can be coupled between the substrate and the deep well, and the ground-coupled well and the deep well. In one aspect, the integrated particle sensor can be operable to detect an ionizing particle generating the single event effect.

In another embodiment, at least one non-transitory machine-readable storage medium can have instructions embodied thereon for single event effect mitigation. The instructions, when executed by one or more processors at an electronic device, can perform the following: detecting an ionizing particle generating a single event effect at a memory cell of the electronic device; switching from the memory cell to a redundant memory cell associated with the memory cell when the single event effect is detected; reconfiguring the memory cell based on the redundant memory cell; and switching from the redundant memory cell to the memory cell after the memory cell is reconfigured.

Figure 1:
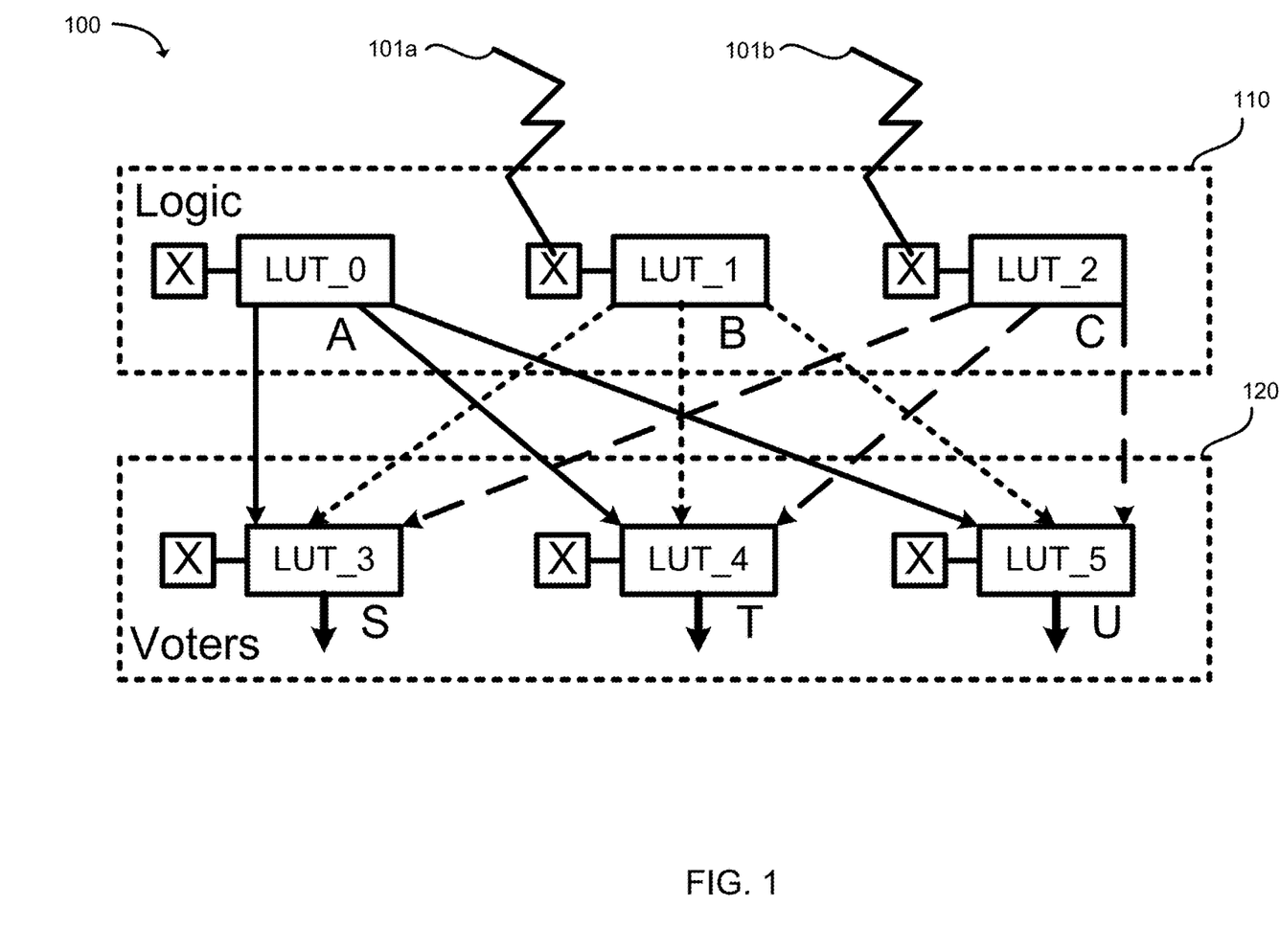
FIG. 1 is a triple modular redundancy (TMR) implementation schematic in accordance with an example.

In one example, as illustrated in reference to FIG. 1, rad-hard devices 100 (e.g., FPGAs) can have error rate information for particular environments based on 12 transistor (T) memory architecture (instead of the 6T memory architecture). However, SEUs and SETs remain present in these environments. In one aspect, redundancy and repair operations can be provided. Triple Modular Redundancy (TMR) can harden systems against SEUs and SETs (101a and 101b) by tripling logical operations and comparing the results with voters to transmit a majority value.

In one aspect, a TMR implementation 100 can use various Look-Up Tables (LUTs) (LUT_0 labeled as 'A'; LUT_1 labeled as 'B'; LUT_2 labeled as C'; LUT_3 labeled as 'S'; LUT_4 labeled as 'T'; and LUT_5 labeled as 'U'). Rad-hard devices (e.g., FPGAs implemented with rad-hard) rely on memories (i.e., the bitstream); consequently, alterations of the memories' initial values can produce undesired behavior.

In one example, each of the logic LUTs can be coupled to voters associated with each of the LUTs. For example, each of LUT_0, LUT_1, and LUT_2 can be coupled to the LUT_3, the LUT_4, and the LUT_5.

For example, a first SEU 101a can interfere with a first memory bit LUT_1 at time=T and a second SEU 101b can interfere with a redundant memory bit LUT_2 at time=T+t which can result in faulty logic 110. Because the first memory bit LUT_1 and the second memory bit LUT_2 have been interfered with, the system cannot determine whether an error has occurred because memory bit LUT_0 cannot be verified using the correct values from LUT_1 and LUT_2.

In one example, as shown in Table A in the first row of values, when no SEUs are present, then the voters 120 S, T, and U can all be correct. That is, A can have a value of '1' and can correspond to the voter of S, B can have a value of '1' and can correspond to the voter T, and C can have the value '1' and can correspond to the voter U. The voter S can be set based on the majority values of A, B, and C. That is, A, B, and C can all have the value of '1' when no SEUs are present, and therefore, voter S can be set to have the value '1' based on the majority of the values. For the same reason, the voters T and U can also have the value of '1' based on the majority of the values from A, B, and C.

In another example, as shown in Table 1 in the second row of values, when 1 SEU is present, then the voters S, T, and U can all be correct. Although B has been changed by an SEU from the value of '1' to the value of '0,' S, T, and U can be based on the majority of the three values of A, B, and C. Therefore, because A and C have the value '1' and B has the value '0,' S, T, and U can all be set to the value of '1'.

However, in shown in Table 1 in the third row of values, when two SEUs are present, then the voters S, T, and U can all be incorrect. In this example, B and C have the value of '0' while A has the value of '1.' Because B and C have been changed to have the incorrect value of '0' and the voters S, T, and U are based on the majority of the values of A, B, and C, each of the voters, S, T, and U can be set to 0—which can be the incorrect value.

TABLE 1

Illustration of Majority Corruption After Two SEUs.

| A | B | C | S | T | U |
| --- | --- | --- | --- | --- | --- |
| 1 | 1 | 1 | 1 | 1 | 1 |
| 1 | 0 | 1 | 1 | 1 | 1 |
| 1 | 0 | 0 | 0 | 0 | 0 |

Therefore, to avoid error accumulation, TMR can be coupled with various repair methods (e.g., bitstream scrubbing). Furthermore, to reduce the reduction in MDC, TMR can be partially applied on a portion of the device.

Because SETs and SEUs can occur in various chip areas over time, error mitigation can use bitstream triplication and Error Code Correction (ECC). In one example, the configuration memories can be scanned, verified, and repaired if faulty. As the implemented design and the associated bitstream increases, the portion of the bitstream that is checked can decrease. Although not always the case, the TIE can be evaluated in the worst-case scenario. For example, when an SEU occurs on the final address the scrubber is to verify, the TIE can be at a maximum value. In contrast, when an SEU occurs at the next address the scrubber is to verify, then the TIE can be a minimum value.

Figure 2:
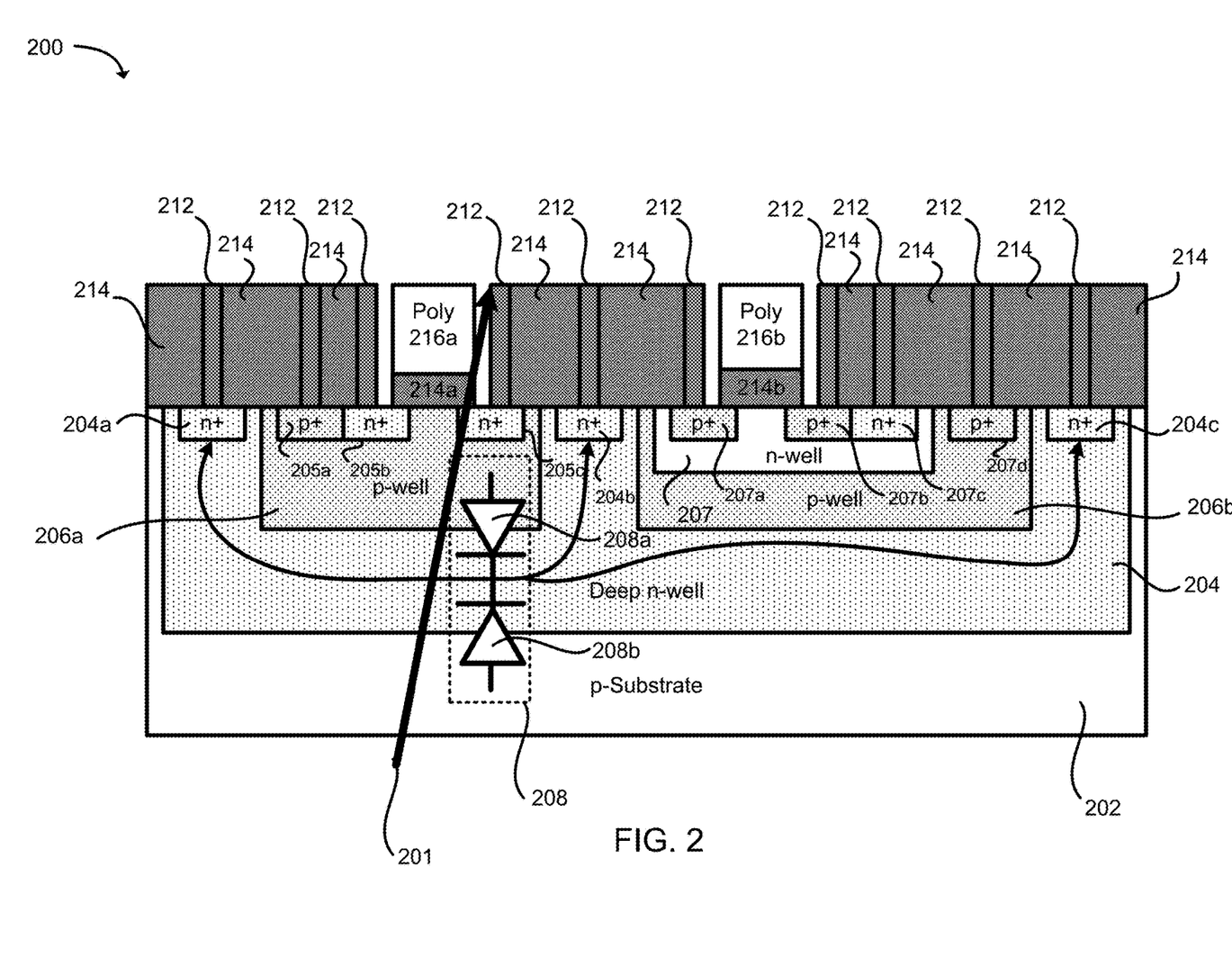
FIG. 2 is an illustration of a particle sensor around the transistors in which p-wells and p-substrate form diodes with the deep n-well in accordance with an example.

In one embodiment, the performance degradation in MDC and TIE can be mitigated by using an integrated sensor. In one example, as illustrated in FIG. 2, an electronic device for single event effect mitigation can comprise a processor and a memory cell 200. The memory cell 200 can include a substrate 202, a deep well 204 coupled to the substrate 202, and a ground-coupled well 206a, 206b coupled to the deep well 204, and an integrated particle sensor 208. In one aspect, the integrated particle sensor 208 can be coupled between: (i) the substrate 202 and the deep well 204, and (ii) the ground-coupled well 206a and the deep well 204. In one aspect, the integrated particle sensor 208 can be operable to detect an ionizing particle 201 generating the single event effect.

In one aspect, a particle 201 with adequate energy to generate an SET or SEU can be detected to trigger reconfiguration. To detect possible single events effects, particle sensors 208 can be integrated to cover an electronic device's complete area. Diodes 208a and 208b protecting portions of the electronic device can be created using a triple-quadruple-well transistor design, as illustrated in FIG. 2. In another example, ECC checkers can be used in place of the diodes 208a and 208b.

In an optional "triple-quadruple-well transistor design," a deep n-well 204 can be positioned below an NMOS transistor and a PMOS transistor with an intervening well coupled between at least one of the NMOS transistor and the PMOS transistor and the deep n-well (e.g., p-well 207). In one aspect, the intervening well can be coupled to an n+ or p+ well (e.g., 207d).

In one aspect, the deep n-well 204 can be coupled to n+ 204a, n+ 204b, and n+ 204c. In one aspect, p-wells 206a and 206b can be connected to the ground 212, and the transistors' bulks 206a and 206b can be electrically isolated from the diodes 208a and 208b of the particle sensor 208 so that the transistors operate similarly with the particle sensor 208 compared to operation without the particle sensor 208. The electrical isolation between the transistors' bulks 206a and 206b and the particle sensor 208 can be accomplished by reducing the cross-section of the bulks 206a and 206b and by reducing generated current in the bulks 206a and 206b using a silicon-on-insulator (SOI) design. Various insulators 214 (e.g., $SiO_2$) can be positioned throughout the design.

Connections to the deep n-well (DNW) 204 can allow current generated by a particle 201 to flow to ground 212 via a conditioner. In one example, each of the transistors covered by the particle sensor 208 can have the same DNW 204. In one example, an NMOS transistor comprising p+ 205a, source n+ 205b, drain n+ 205c, insulator 214a, and gate 216a can be directly coupled to the DNW 204, and the PMOS transistor comprising n+ 207c, source p+ 207b, drain p+ 207a, insulator 214a, and gate 216b can be directly coupled to the DNW 204. The insulators 214a and 214b can each be coupled to the polysilicon gates 216a, 216b, respectively.

In one aspect, the integrated particle sensor 208 can be operable to detect an ionizing particle within a selected time after a single event effect (SET or SEU) occurs. In one example, the selected time can be less than 100 milliseconds after the single event effect occurs. In another example, the selected time can be less than 50 milliseconds after the single event effect occurs. In one example, the selected time can be less than 10 milliseconds after the single event effect occurs. In one example, the selected time can be less than 1 millisecond after the single event effect occurs.

In one aspect, the memory cell can comprise at least one of 4 transistors, 6 transistors, 8 transistors, 10 transistors, 12 transistors, and a combination thereof. In one aspect, the electronic device comprises a field-programmable gate array (FPGA), an application-specific integrated circuit (ASIC), coarse grained reconfigurable architecture (CGRA), central processing unit (CPU), graphics processing unit (GPU), hardware accelerator, or a combination thereof, although other electronic devices may be used. As such, a processor can be any computing device which processes data and is in no way limited to ASIC micro-processors.

Figure 3:
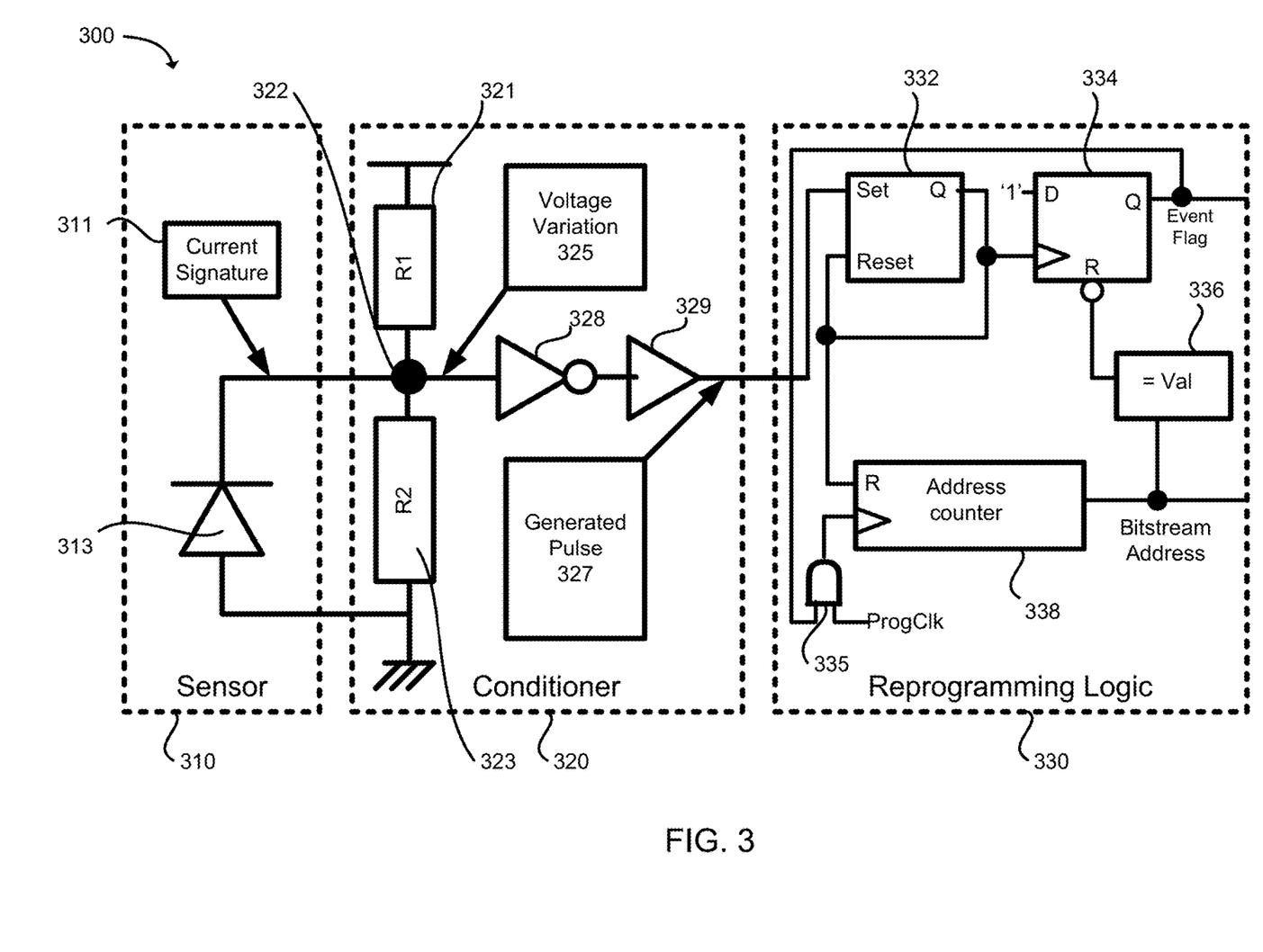
FIG. 3 is a sensor signal processing schematic in which a sensor generates current, and a conditioner transforms the current into a pulse and triggers reconfiguration in accordance with an example.

In one embodiment, as illustrated in FIG. 3, a sensor conditioner can comprise the sensor 310, the conditioner 320, and the reprogramming logic 330. In one aspect, a sensor conditioner 300 can include at least one of a voltage divider 321, 323, an inverter 328, a buffer 329, and an amplifier (not shown). In one aspect, the sensor conditioner 300 can be tuned to generate a pulse 327 and activate reconfiguration via the event flag when the single event effect occurs.

In one example, when an event occurs, the diode 313 from the particle sensor can be blocked and may not impact the remainder of the memory cell. The voltage divider can be scaled such that R1>R2 and VR2 322 implies V outinv=VDD. Both the inverter 328 and the buffer 329 can be balanced when V in=VDD/2 so that V out=VDD/2. The ProgClk gating 335 can disable the reprogramming logic 330.

In one aspect, when an SET or SEU occurs, the particle sensor can deliver a current 311 to R2 323, which can increase VR2 322 and generate a voltage drop of V outinv. The buffer 329 can amplify V outinv and trigger the reprogramming 330 when the voltage variation 325 is sufficient. To preserve conditioner functionality, the following equations are preserved:

$$V_{R_2} \leq \frac{VDD}{2} - \frac{VDD}{2 \times \text{Gain}}$$

$$R_1 \geq \frac{R_2(\text{Gain} + 1)}{\text{Gain} - 1}$$

In one aspect, conditioner sizes can depend on the technology node and the memory cell's sensitivity. The closer VR2 is to VDD/2, the more short-circuit current can stream through the inverter 328. The closer VR2 is to ground, the lower the sensitivity. High resistor values can increase sensitivity, but at the cost of area efficiency; therefore, sensitivity can be tuned so that a threshold energy level of particles that can cause an SEU or SET can trigger reprogramming.

In one aspect, when an SEU or SET occurs, the generated pulse 327 can activate reprogramming by setting the logic block 332 (e.g., a Set/Reset Flip Flop). The setting of the logic block 332 can reset the address counter 338. The setting of the logic block 332 can also activate logic block 334 (e.g., a D-type Flip Flop with Set/Reset) which can activate the event flag. The activating of the event flag can activate the gate 335 and thereby provide a bitstream address from the address counter 338. The value of the bitstream address can be stored in block 336.

Figure 4A:
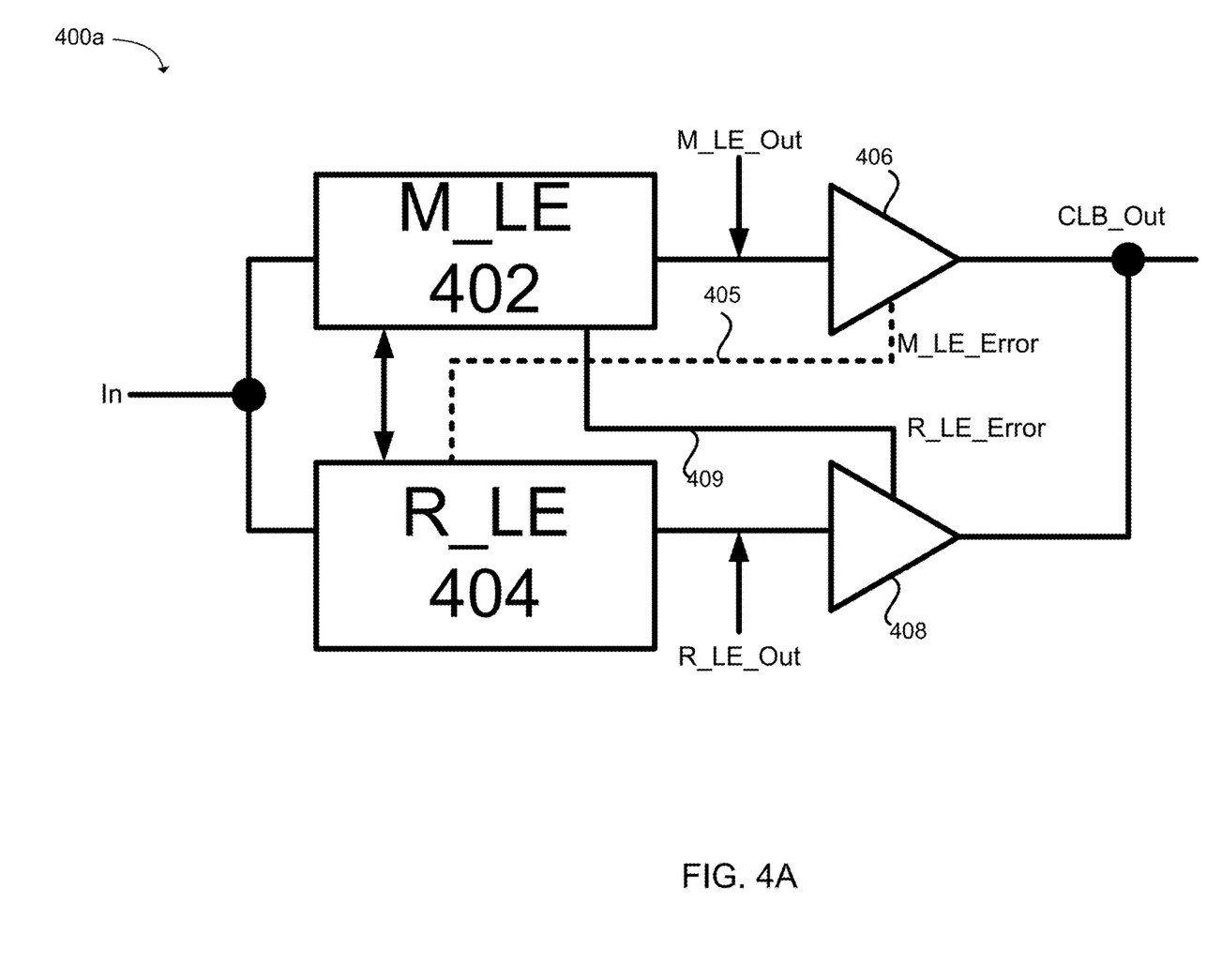
FIG. 4A is an illustration of hardware interconnection between a master logic element (M_LE) and a redundant logic element (R_LE) for dual redundancy in accordance with an example.
Figure 4B:
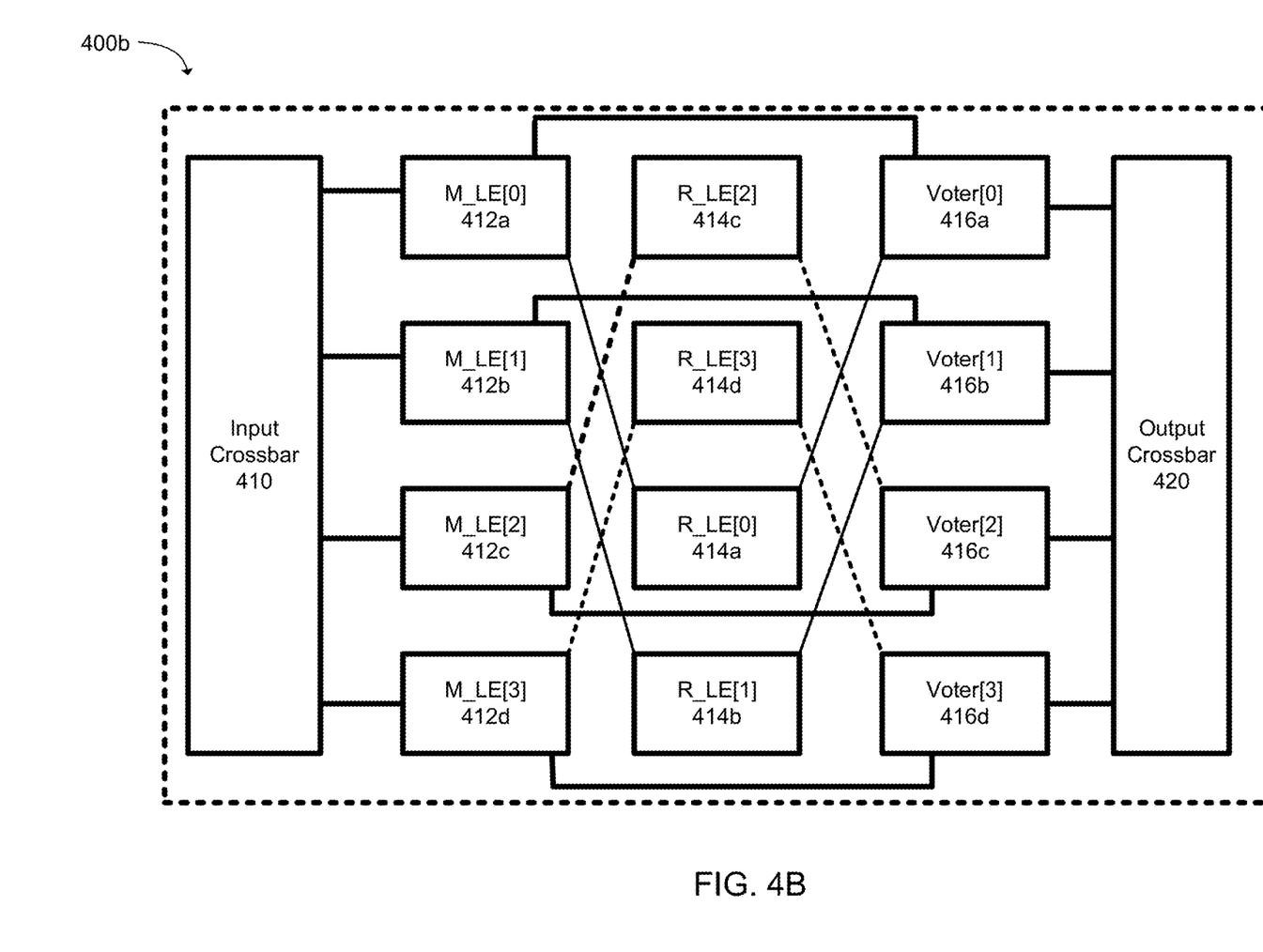
FIG. 4B is a logic element (LE) floorplan example in an 8 LE configurable logic block (CLB) architecture in accordance with an example.
Figure 4C:
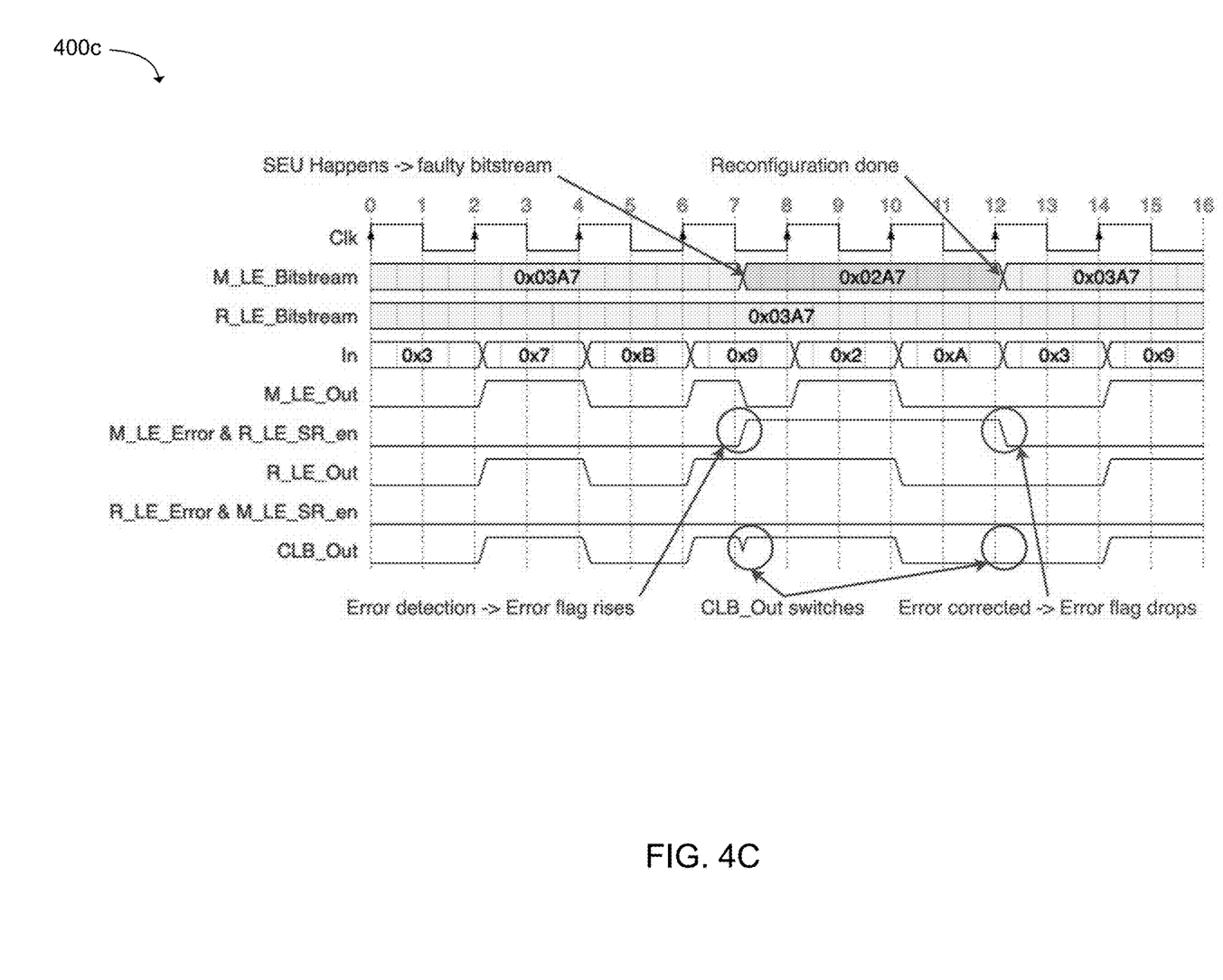
FIG. 4C illustrates waveforms of a look-up table (LUT) 4 with a single event upset (SEU) on master logic element (M_LE) bitstream with redundant logic element output (R_LE_Out) until M_LE is repaired in accordance with an example.

In another embodiment, as illustrated in FIG. 4A to 4C, a processor can be configured to switch from a memory cell 402 to a redundant memory cell 404 associated with the memory cell 402 when the single event effect occurs.

As illustrated in FIG. 4A, functionality 400a for a master logic element 402 can be associated with a redundant logic element 404. In one aspect, the redundant memory cell (e.g., R_LE 404) associated with the memory cell (e.g., M_LE 402) can include a configuration memory bit for the memory cell.

In one example, the output signal from the redundant memory cell 404 can be compared to the value of the redundant memory cell 404 stored at the memory cell 402 using the operator 408. When the value of the output of the redundant memory cell 404 does not match the value of the redundant memory cell stored at the memory cell 402, then an error signal (e.g., R_LE Error) can be generated using signal 409.

In another example, the output signal from the memory cell 402 can be compared to the value of the memory cell 402 stored at the redundant memory cell 404 using the operator 406. When the value of the output of the memory cell 402 does not match the value of the memory cell 402 stored at the redundant memory cell 404, then an error signal (e.g., M_LE Error) can be generated using signal 405.

In another example, as illustrated in FIG. 4B, an input crossbar 410 and an output crossbar 420 of a configurable logic block (CLB) 400b can include an even number of Logic Elements (LEs). LEs can divided into two groups: Master LE (M_LE) 412a, 412b, 412c, and 412d, and Redundant LE (R_LE) 414a, 414b, 414c, and 414d. Each of the Master LEs 412a, 412b, 412c, and 412d can be coupled to a voter 416a, 416b, 416c, and 416d, respectively.

In one aspect, a redundant memory cell (e.g., 414a, 414b, 414c, and 414d) associated with the memory cell (e.g., 412a, 412b, 412c, and 412d) can be positioned at a threshold distance that prevents an ionizing particle from generating the single event effect in both the memory cell (e.g., 412a, 412b, 412c, and 412d) and the redundant memory cell (e.g., 414a, 414b, 414c, and 414d).

In one aspect, the processor can be configured to switch from the memory cell (e.g., 412a, 412b, 412c, and 412d) to a redundant memory cell (e.g., 414a, 414b, 414c, and 414d) associated with the memory cell (e.g., 412a, 412b, 412c, and 412d) when a configuration memory bit is activated. In one aspect, a processor can be configured to switch from the memory cell (e.g., 412a, 412b, 412c, and 412d) to a redundant memory cell (e.g., 414a, 414b, 414c, and 414d) associated with the memory cell (e.g., 412a, 412b, 412c, and 412d) using an interconnection gating signal. In one aspect, the redundant memory cell (e.g., 414a, 414b, 414c, and 414d) associated with the memory cell (e.g., 412a, 412b, 412c, and 412d) can include a configuration memory bit for the memory cell (e.g., 412a, 412b, 412c, and 412d).

In one aspect, activation and deactivation can be controlled by configuration memory bits (SR en) acting as flags and an interconnection gating signal. M_LE and R_LE can each contain the SR en bit of each other to prevent alteration from SEUs or SETs. The integrated sensor can detect a particle strike and inform the voters 416a, 416b, 416c, and 416d to propagate the redundant values until partial reconfiguration has been completed.

As an example, FIG. 4C shows the waveforms 400c of a 4-inputs Look-Up Table (LUT4). In this example, an SEU occurs on the M_LE Bitstream and generates an error in the M LE Out bitstream which leads to an error flag that rises (e.g., M_LE Error & R_LE_SR_en is activated and the value in the M_LE Bitstream has changed from the value of 0x03A7' to the value of '0x02A7').

When the M_LE is faulty, the CLB Out output switches from the M_LE_Out output to the R_LE_Out output. This prevents the CLB Out signal waveform from changing value from 1 to 0. When the reprogramming has been completed (i.e., the value 0x02A7' in the M_LE-Bitstream has changed back to the value of '0x03A7'), the CLB Out output can switch back to the M_LE_Out bitstream and the error flag can drop (as shown in the M_LE Error & R_LE_SR_en bitstream). Therefore, activation and bitstream generator adaptation can enable partial reconfiguration. Timing constraints can be eased by physical design (i.e., the M_LE and R_LE delays can be substantially identical).

Figure 5:
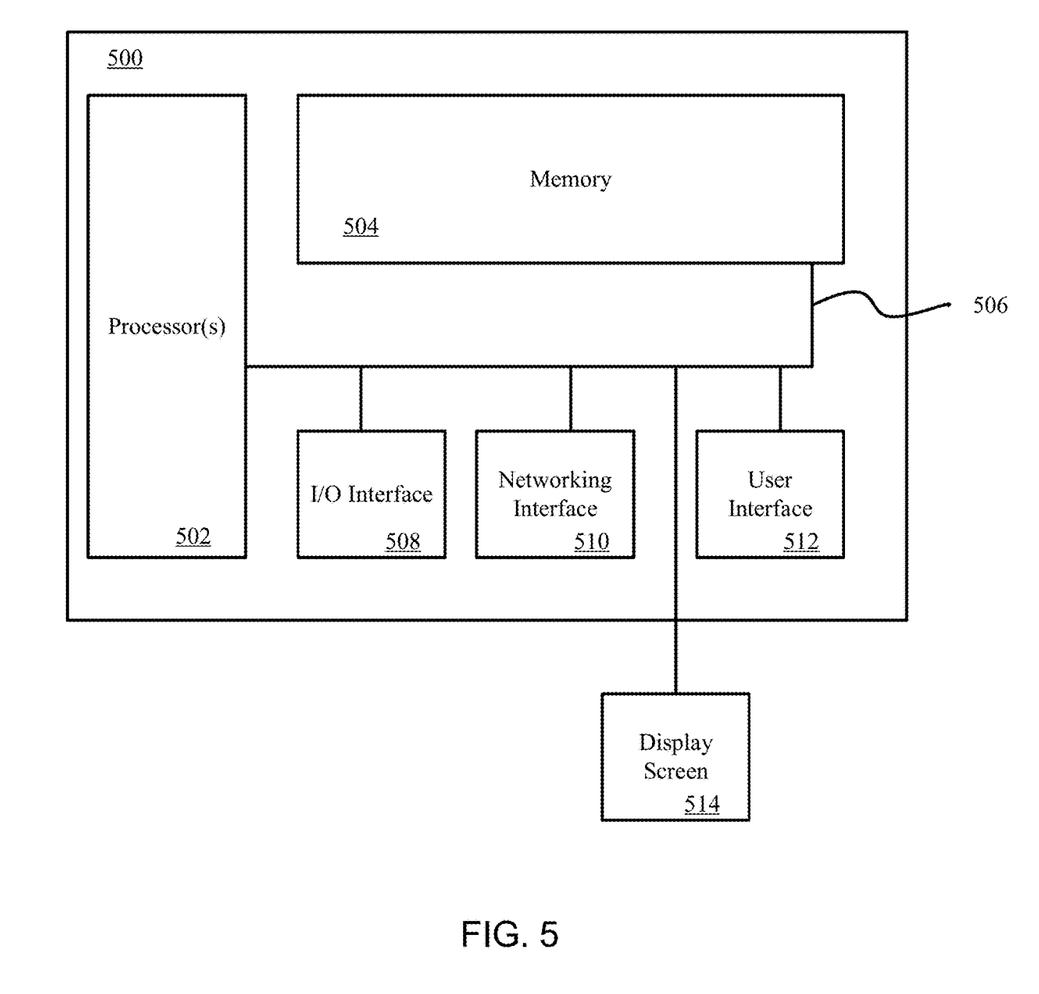
FIG. 5 illustrates a general computing system or device that can be employed in accordance with an example.

FIG. 5 illustrates a general computing system or device 500 that can be employed in the present technology. The computing system 500 can include a processor 502 in communication with a memory 504. The memory 504 can include any device, combination of devices, circuitry, and the like that is capable of storing, accessing, organizing, and/or retrieving data. Non-limiting examples include SANs (Storage Area Network), cloud storage networks, volatile or non-volatile RAM, phase change memory, optical media, hard-drive type media, and the like, including combinations thereof.

The computing system or device 500 additionally includes a local communication interface 506 for connectivity between the various components of the system. For example, the local communication interface 506 can be a local data bus and/or any related address or control busses as may be desired.

The computing system or device 500 can also include an I/O (input/output) interface 508 for controlling the I/O functions of the system, as well as for I/O connectivity to devices outside of the computing system 500. A network interface 510 can also be included for network connectivity. The network interface 510 can control network communications both within the system and outside of the system. The network interface can include a wired interface, a wireless interface, a Bluetooth interface, optical interface, and the like, including appropriate combinations thereof. Furthermore, the computing system 500 can additionally include a user interface 512, a display device 514, as well as various other components that would be beneficial for such a system.

The processor 502 can be a single or multiple processors, and the memory 504 can be a single or multiple memories. The local communication interface 506 can be used as a pathway to facilitate communication between any of a single processor, multiple processors, a single memory, multiple memories, the various interfaces, and the like, in any useful combination.

Figure 6:
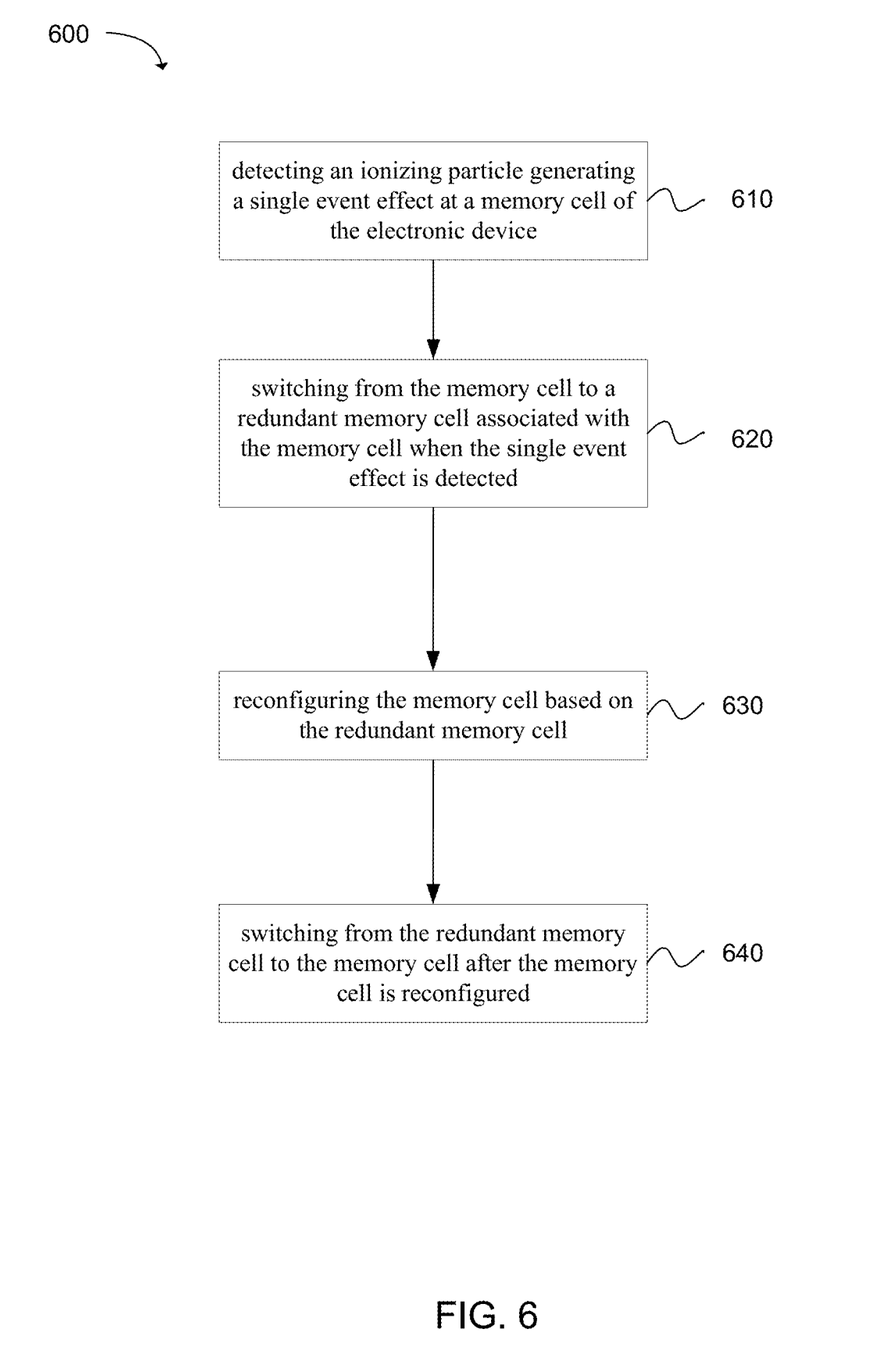
FIG. 6 depicts a flowchart of a machine-readable storage medium having instructions embodied thereon for single event effect mitigation in accordance with an example.

FIG. 6 illustrates a flow diagram of a method according to the present technology. For simplicity of explanation, the method is depicted and described as a series of acts. However, acts in accordance with this disclosure can occur in various orders and/or concurrently, and with other acts not presented and described herein. Furthermore, not all illustrated acts may be used to implement the methods in accordance with the disclosed subject matter.

FIG. 6 provides at least one machine readable storage medium having instructions 600 embodied thereon for single event effect mitigation, as shown in FIG. 6. The instructions can be executed on a machine, where the instructions are included on at least one computer readable medium or one non-transitory machine-readable storage medium. The instructions when executed can perform detecting an ionizing particle generating a single event effect at a memory cell of the electronic device, as shown in block 610. The instructions when executed can perform switching from the memory cell to a redundant memory cell associated with the memory cell when the single event effect is detected, as shown in block 620. The instructions when executed can perform reconfiguring the memory cell based on the redundant memory cell, as shown in block 630. The instructions when executed can perform switching from the redundant memory cell to the memory cell after the memory cell is reconfigured, as shown in block 640.

In one aspect, the instructions when executed can perform detecting an ionizing particle within a selected time after a single event effect (SET or SEU) occurs. In one example, the selected time can be less than 100 milliseconds after the single event effect occurs. In another example, the selected time can be less than 50 milliseconds after the single event effect occurs. In one example, the selected time can be less than 10 milliseconds after the single event effect occurs. In one example, the selected time can be less than 1 millisecond after the single event effect occurs.

In another aspect, the instructions when executed can perform switching from the memory cell to the redundant memory cell associated with the memory cell when a configuration memory bit is activated.

In another aspect, the instructions when executed can perform switching from the memory cell to the redundant memory cell associated with the memory cell using an interconnection gating signal.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. The low energy fixed location node, wireless device, and location server can also include a transceiver module (i.e., transceiver), a counter module (i.e., counter), a processing module (i.e., processor), and/or a clock module (i.e., clock) or timer module (i.e., timer). One or more programs that can implement or utilize the various techniques described herein can use an application programming interface (API), reusable controls, and the like. Such programs can be implemented in a high-level procedural or object-oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules and can be embodied in any suitable form and organized within any suitable type of data structure. The operational data can be collected as a single data set or can be distributed over different locations including over different storage devices, and can exist, at least partially, merely as electronic signals on a system or network. The modules can be passive or active, including agents operable to perform desired functions.

The following examples are provided to promote a clearer understanding of certain embodiments of the present disclosure and are in no way meant as a limitation thereon.

Example 1: Methodology

The FPGA of the present disclosure was compared to a Rad-Hard FPGA implementing TMR as a baseline. All experiments focused on the FPGA's main element a CLB—and all results were normalized to the reference design. The Rad-Hard FPGA CLB architecture that was used as the reference had eight Logic Elements (LEs) with each LE containing a 6-inputs LUT_(LUTE) and two FFs. This architecture was created as a design reference with 6T and 12T memory cell architectures (Ref CLB6T and Ref CLB12T). Two CLBs were designed based on these references using the present disclosure (SR CLB6T and SR CLB12T). All CLBs were designed using 40 nm technology mapped netlists. The 6T's CLB area was determined before placement and routing using Synopsys Design Compiler and memory cell area. The 12T's area was scaled to memory cells. For a square element, the relative area overhead can be defined as:

$$\text{Area}_{overhead} = \frac{\left(\sqrt{SR_{CLB_{area}}} + DNW_{margin}\right)^2}{\text{Ref\_CLB}_{area}}$$

MDC was calculated as the maximum number of LEs the initial design would implement to fit the FPGA size of 330 k LE. Calculations were done for fully TMRed and fully SRed designs by scaling of Ref CLB and SR CLB. TMR TIE was calculated from Ref CLB with a bitstream scrubbing operation. SR TIE was calculated as time to detect (worst case 1 clock period) and number of addresses to write. Then, the benefit of partial SR over partial TMR was calculated for 25%, 50%, and 75% redundancy of 100,000 and 20,000 LE designs. The TIE was calculated as the sum of times to detect and reconfigure with 8 and 32 bits bitstream width for the same designs, redundancies, and clock frequency. To get an objective interpretation of the results, the probability for the TMR TIE to be faster than SR TIE was calculated.

Example 2: Time In Error (TIE) Enhancement

TIE was calculated in the best case for the TMR design by considering the 64 bits of the LUT as an LE bitstream. Table 2 provides values for the two design sizes in column (col.) 1, two bitstream widths in col. 2 and four redundancy ratios in col. 3. Col. 4 to 6 give best, average, and worst cases for TMR TIE, while col. 7 gives SR TIE's constant values.

TABLE 2

Comparison between SR_TIE and TMR_TIE for different design size, bitstream width, and redundancy ratio. The right column shows the probability in ppm that TMR_TIE is faster than SR_TIE.

| Initial # of LE | Bitstream Width | Redundancy | TMR_TIE (clk period) Min | Average | Max | SR-TIE (clk period) | SR_TIE (clk period) Min | Average | Max | TMR ≤ SR (ppm) |
|---|---|---|---|---|---|---|---|---|---|---|
| 100k | 32 | 100% | 2 | 300,001 | 600,000 | 3 | 0.67 | 100,000.33 | 200,000.00 | 1.667 |
|  |  | 75% | 2 | 250,001 | 500,000 | 3 | 0.67 | 83,333.67 | 166,666.67 | 2.000 |
|  |  | 50% | 2 | 200,001 | 400,000 | 3 | 0.67 | 66,667.00 | 133,333.33 | 2.500 |
|  |  | 25% | 2 | 150,001 | 300,000 | 3 | 0.67 | 50,000.33 | 100,000.00 | 3.333 |
|  | 8 | 100% | 2 | 1,200,001 | 2,400,000 | 9 | 0.22 | 133,333.44 | 266,666.67 | 2.917 |
|  |  | 75% | 2 | 1,000,001 | 2,000,000 | 9 | 0.22 | 111,111.22 | 222,222.22 | 3.500 |
|  |  | 50% | 2 | 800,001 | 1,600,000 | 9 | 0.22 | 88,889.00 | 177,777.78 | 4.375 |
|  |  | 25% | 2 | 600,001 | 1,200,000 | 9 | 0.22 | 66,666.78 | 133,333.33 | 5.833 |
| 20k | 32 | 100% | 2 | 60,001 | 120,000 | 3 | 0.67 | 20,000.33 | 40,000.00 | 8.333 |
|  |  | 75% | 2 | 50,001 | 100,000 | 3 | 0.67 | 16,667.00 | 33,333.33 | 10.000 |
|  |  | 50% | 2 | 40,001 | 80,000 | 3 | 0.67 | 13,333.67 | 26,666.67 | 12.500 |
|  |  | 25% | 2 | 30,001 | 60,000 | 3 | 0.67 | 10,000.33 | 20,000.00 | 16.667 |
|  | 8 | 100% | 2 | 240,001 | 480,000 | 9 | 0.22 | 26,666.78 | 53,333.33 | 14.583 |
|  |  | 75% | 2 | 200,001 | 400,000 | 9 | 0.22 | 22,222.33 | 44,444.44 | 17.500 |
|  |  | 50% | 2 | 160,001 | 320,000 | 9 | 0.22 | 17,777.89 | 35,555.56 | 21.875 |
|  |  | 25% | 2 | 120,001 | 240,000 | 9 | 0.22 | 13,333.44 | 26,666.67 | 29.167 |

TIE's comparison is provided in col. 8 to 10, and the TMR TIE probability to outperform SR TIE is provided in parts per million (ppm) in col. 11. This table shows that the design's LE number, the redundancy ratio, and the bitstream width are parts of the TIE variation.

This table clarifies the different aspects of both TMR and SR methods. For example, TMR time to detect can vary, while SR can always be up to one clock cycle. TMR can correct the bitstream's faulty part directly, while SR reprograms the entire LE.

TMR TIE has three example cases: (a) Min: an SEU happened on the next address and the scrubber has to check, which is the best-case scenario and uses a two-clock cycle constant; (b) Max: an SEU happened on the last address the scrubber has to check, which is the worst-case scenario, and is calculated as:

$$\text{TMR\_TIE}_{Max} = \frac{nb_{LE} \times \text{length }(LUT6_{Bitstream})}{\text{width (Bitstream)}} + 1;$$

And (c) Average: an SEU happened in the middle of the scrubber's cycle, which is the mean value between Min and Max.

SR TIE uses the bitstream width, and therefore the event detection is up to one clock cycle, and the total TIE can be calculated as:

$$\text{SR\_TIE} = 1 + \frac{\text{length }(LUT6_{Bitstream})}{\text{width (Bitstream)}}$$

Table I shows that in the Min case, TMR can be up to 4.55 faster than SR, but that on average, SR has a lower TIE than TMR. The average TIE increase over TMR ranges from a low of 10,000× faster for a 20,000 LE design with a bitstream width of 32 bits, and 25% redundancy, up to a high of more than 133,000× faster for a 100,000 LE design with an 8 bit bitstream width and 100% redundancy. Therefore, the probability of TMR outperforming SR in TIE is less than 30 ppm overall.

Example 3: Area Efficiency

Results show an increase of 55.46% from Ref CLB6T (3,930.8 m2) to Ref CLB12T (6,111.15 m2) and 41.08% from SR CLB6T (6,009.2 m2) to SR CLB12T (8,477.74 m2). The results also show an increase in area from SR CLBs over Ref CLBs of respectively 55.46% and 41.08% for 6T and 12T memory architectures, because of spaces between DNWs. However, due to previous TIE results and SR's detection of both SEU and SET, it is possible to keep a 6T memory architecture in SR without performance degradation over 12T Rad-Hard FPGAs. By using a 6T SR rather than a 12T, it is possible to avoid the area increase. MDC for an FPGA of 330 k LE demonstrates a 50% increase for Smart-Redundancy (165,000 LE vs 110,000). Partial redundancy shows that the design size is not a factor in MDC gain, but the redundancy ratio is a factor. Table 3 shows a 16.67% increase for 25% redundancy, and up to 33.33% for full redundancy.

TABLE 3

Comparison between SR's and TMR's MDC for different design size and redundancy ratio.

| Initial # of LE | Redundancy | # of LE TMR | # of LE SR | SR's LE reduction (%) |
|---|---|---|---|---|
| 100,000 | 100% | 300,000 | 200,000 | 33.33 |
|  | 75% | 250,000 | 175,000 | 30.00 |
|  | 50% | 200,000 | 150,000 | 25.00 |
|  | 25% | 150,000 | 125,000 | 16.67 |
| 20,000 | 100% | 60,000 | 40,000 | 33.33 |
|  | 75% | 50,000 | 35,000 | 30.00 |
|  | 50% | 40,000 | 30,000 | 25.00 |
|  | 25% | 30,000 | 25,000 | 16.67 |

While the flowcharts presented for this technology may imply a specific order of execution, the order of execution may differ from what is illustrated. For example, the order of two more blocks may be rearranged relative to the order shown. Further, two or more blocks shown in succession may be executed in parallel or with partial parallelization. In some configurations, one or more blocks shown in the flow chart may be omitted or skipped. Any number of counters, state variables, warning semaphores, or messages might be added to the logical flow for purposes of enhanced utility, accounting, performance, measurement, troubleshooting or for similar reasons.

Reference throughout this specification to "an example" means that a particular feature, structure, or characteristic described in connection with the example is included in at least one embodiment of the present invention. Thus, appearances of the phrases "in an example" in various places throughout this specification are not necessarily all referring to the same embodiment.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

What is claimed is:

1. A electronic device for single event effect mitigation, comprising:
    a processor;
    a memory cell comprising:
        a substrate;
        a deep well coupled to the substrate; and
        a ground-coupled well coupled to the deep well;
    an integrated particle sensor comprising one or more p-n junctions intentionally configured for actively detecting particle strikes, the integrated particle sensor coupled between:
        the substrate and the deep well, and
        the ground-coupled well and the deep well,
    wherein the integrated particle sensor is operable to detect an ionizing radiation particle generating the single event effect and output a corresponding detection signal; and
    a sensor conditioner coupled to directly receive the detection signal from the integrated particle sensor, wherein the sensor conditioner includes a current-to-voltage converter, an amplifier, and a pulse generator, and wherein the sensor conditioner is tuned to process the detection signal to generate a pulse and activate reconfiguration to a redundant memory cell when the single event effect occurs.

2. The electronic device of claim 1, wherein the memory cell has a triple-quadruple well transistor design.

3. The electronic device of claim 1, wherein the integrated particle sensor is operable to detect an ionizing particle less than 100 milliseconds after the single event effect occurs.

4. The electronic device of claim 1, wherein the processor is configured to switch from the memory cell to a redundant memory cell associated with the memory cell when the single event effect occurs.

5. The electronic device of claim 1, wherein a redundant memory cell associated with the memory cell is positioned at a threshold distance that prevents the ionizing particle from generating the single event effect in both the memory cell and the redundant memory cell.

6. The electronic device of claim 1, wherein the processor is configured to switch from the memory cell to a redundant memory cell associated with the memory cell when a configuration memory bit is activated.

7. The electronic device of claim 1, wherein the processor is configured to switch from the memory cell to a redundant memory cell associated with the memory cell using an interconnection gating signal.

8. The electronic device of claim 1, wherein a redundant memory cell associated the memory cell includes a configuration memory bit for the memory cell.

9. The electronic device of claim 1, wherein the electronic device comprises a field-programmable gate array (FPGA), an application-specific integrated circuit (ASIC), coarse grained reconfigurable architecture (CGRA), central processing unit (CPU), graphics processing unit (GPU), hardware accelerator, or a combination thereof.

10. The electronic device of claim 1, wherein the memory cell comprises at least one of 4 transistors, 6 transistors, 8 transistors, 10 transistors, 12 transistors, and a combination thereof.

11. The electronic device of claim 1, wherein the single event effect is a single event transient (SET) or a single event upset (SEU).

12. The electronic device of claim 1, wherein the sensor conditioner that includes at least one of a voltage divider, an inverter, and a buffer.

13. A field-programmable gate array (FPGA) operable for single event effect mitigation, comprising:
    a memory cell comprising:
        a substrate;
        a deep well coupled to the substrate;
        a ground-coupled well coupled to the deep well;
    an integrated particle sensor comprising one or more p-n junctions intentionally configured for actively detecting particle strikes, the integrated particle sensor coupled between:
        the substrate and the deep well, and
        the ground-coupled well and the deep well, wherein the integrated particle sensor is operable to detect an ionizing particle generating the single event effect and output a corresponding detection signal; and a sensor conditioner coupled to directly receive the detection signal from the integrated particle sensor, wherein the sensor conditioner that includes a current-to-voltage converter, an amplifier, and a pulse generator, and wherein the sensor conditioner is tuned to process the detection signal to generate a pulse and activate reconfiguration to a redundant memory cell when the single event effect occurs.

14. The FPGA of claim 13, wherein the memory cell has a triple-quadruple well transistor design.

15. The FPGA of claim 13, wherein a redundant memory cell associated with the memory cell is positioned at a threshold distance that prevents the ionizing particle from generating the single event effect in both the memory cell and the redundant memory cell.

16. The FPGA of claim 13, wherein the memory cell comprises at least one of 4 transistors, 6 transistors, 8 transistors, 10 transistors, 12 transistors, and a combination thereof.

17. The FPGA of claim 13, wherein the single event effect is a single event transient (SET) or a single event upset (SEU).

18. The FPGA of claim 13, wherein the sensor conditioner includes at least one of a voltage divider, an inverter, and a buffer.

* * * * *